US010213940B2

(12) United States Patent
Boguslavsky et al.

(10) Patent No.: US 10,213,940 B2
(45) Date of Patent: Feb. 26, 2019

(54) DEVICE AND METHOD FOR CLEAVING A CRYSTALLINE SAMPLE

(71) Applicants: Dimitry Boguslavsky, Haifa (IL); Mark Kovler, Toronto (CA)

(72) Inventors: Dimitry Boguslavsky, Haifa (IL); Mark Kovler, Toronto (CA)

(73) Assignee: IB Labs, Inc., Brooklyn, NY (US)

( * ) Notice: Subject to any disclaimer, the term of this patent is extended or adjusted under 35 U.S.C. 154(b) by 514 days.

(21) Appl. No.: 14/871,668

(22) Filed: Sep. 30, 2015

(65) Prior Publication Data
US 2016/0089813 A1    Mar. 31, 2016

Related U.S. Application Data

(60) Provisional application No. 62/057,324, filed on Sep. 30, 2014.

(51) Int. Cl.
B28D 5/00        (2006.01)
H01L 21/67       (2006.01)
H01L 21/78       (2006.01)

(52) U.S. Cl.
CPC ......... *B28D 5/0017* (2013.01); *B28D 5/0052* (2013.01); *H01L 21/67092* (2013.01); *H01L 21/78* (2013.01)

(58) Field of Classification Search
CPC ....... B28D 5/0017; B28D 5/0052; B28D 5/00

USPC .............. 125/23.01, 35; 451/41; 225/96.5, 6
See application file for complete search history.

(56) References Cited

U.S. PATENT DOCUMENTS

| 4,229,876 | A | * | 10/1980 | Doty | C03B 37/16 225/101 |
| 4,474,319 | A | * | 10/1984 | Walker | B26F 3/002 225/101 |
| 4,557,049 | A | * | 12/1985 | Cribbs | G02B 6/25 225/96 |
| 5,740,953 | A | | 4/1998 | Smith et al. | |
| 6,223,961 | B1 | | 5/2001 | Boguslavsky et al. | |
| 6,513,694 | B1 | | 2/2003 | Xu et al. | |
| 7,262,115 | B2 | | 8/2007 | Baylis et al. | |

* cited by examiner

*Primary Examiner* — Robert Rose
(74) *Attorney, Agent, or Firm* — Andrew D. Fortney; Central California IP Group, P.C.

(57) ABSTRACT

A device for cleaving a crystalline sample, the device comprises: upper and lower bending elements that are arranged to contact upper and lower surfaces of the crystalline sample and to apply a bending moment on the crystalline sample; a first surface impact element that contacts a first surface of the crystalline sample; a cleaving element that is arranged to impact a second surface of the crystalline sample while the bending moment is applied on the crystalline element; wherein the second surface is opposite to the first side and oriented to the upper and lower surfaces of the crystalline sample wherein the device excludes any second surface alignment element for aligning the crystalline sample by contacting the second surface.

20 Claims, 11 Drawing Sheets

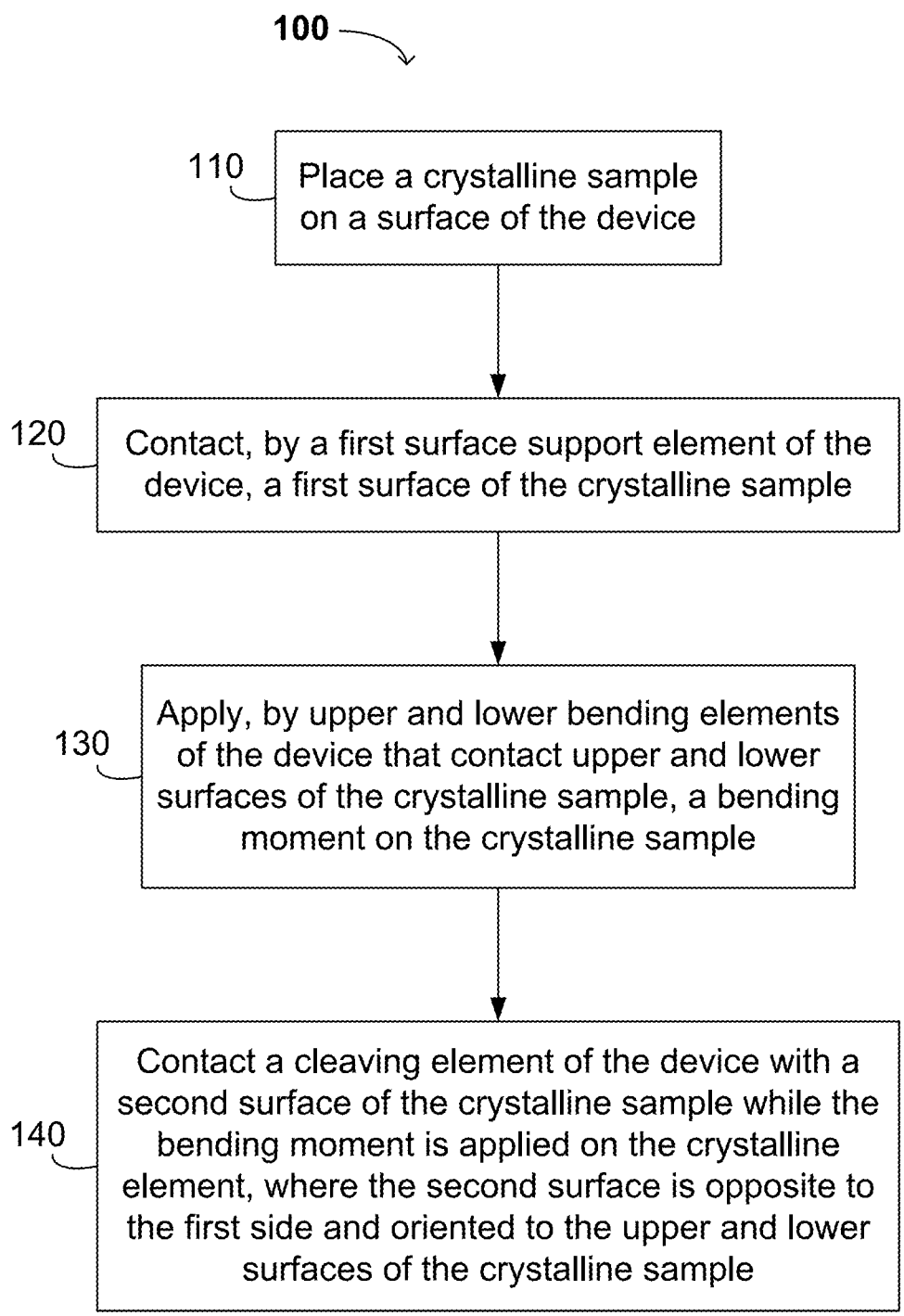

— DEVICE AND METHOD FOR CLEAVING A CRYSTALLINE SAMPLE

CROSS REFERENCE TO RELATED APPLICATION

This application claims the benefit of U.S. Provisional Patent Application No. 62/057,324, filed on Sep. 30, 2014, incorporated herein by reference as if fully set forth herein.

FIELD OF THE INVENTION

The present disclosure generally relates to the field(s) of techniques and equipment for cleaving crystalline samples, particularly in the fields of semiconductors, microelectromechanical system (MEMS) devices, and materials science.

SUMMARY OF THE INVENTION

The disclosed apparatus and method are applicable, but not restricted, to cross-sectioning for subsequent imaging and micro-analysis, dicing of microelectronic chips out of semiconductor wafers, and specimen extraction out of the bulk of mono-crystalline materials. The apparatus is generally a technological system intended to implement the present cleaving method (e.g., for monocrystalline specimens).

In one aspect, the present invention relates to a device for cleaving a crystalline sample, comprising upper and lower bending elements that are arranged to contact upper and lower surfaces of the crystalline sample and to apply a bending moment or force on the crystalline sample; a first support element operably connected to a first actuator configured to bring the first support element into contact with a first side surface of the crystalline sample; and a cleaving element operably connected to a second actuator configured to cause the cleaving element to apply a force to a second side surface of the crystalline sample opposite to the first side surface while the bending moment or force is applied on the crystalline element. Typically, the second surface is opposite to the first side, and may be oriented to the upper and lower surfaces of the crystalline sample. For example, the second surface may have a first angle with respect to the upper surface of the crystalline sample and a second angle with respect to the lower surface of the crystalline sample. The first and second angles may be the same or different, and each of the first and second angles may vary over the length or width of the sample. In some embodiments, the device excludes any second surface alignment element for aligning the crystalline sample by contacting the second surface.

In various embodiments, the upper and lower bending elements comprise a pair of upper bending elements and a lower bending element. The lower bending element may have a first trajectory (e.g., force vector) on the lower surface of the crystalline sample that is located between second and third trajectories of the upper bending elements on the upper surface of the crystalline sample. In an exemplary configuration of the present device, the sample is in a first plane (e.g., in the sample holder), the upper and lower bending elements are not in the first plane, and the upper and lower bending elements are not in any same or common plane orthogonal to the first plane.

In further embodiments, the lower bending element is configured to contact only a portion of the lower surface of the crystalline sample. For example, the portion of the lower surface of the crystalline sample contacted by the lower bending element may have an area that does not exceed 20% (and in a further example, 10%) of the total area of the lower surface of the crystalline sample. In some embodiments, the upper and lower bending elements are configured to contact the upper and lower surfaces of the crystalline sample without contacting the second surface of the sample.

In additional embodiments, the device may further comprise one or more end-effecters configured to position the sample for cleaving with the cleaving element (and optionally align the sample with the cleaving element along a cleaving line or plane), and/or a first surface support element configured to contact the first surface of the specimen and move the specimen (e.g., towards the cleaving element) until the specimen contacts the one or more end-effecters.

In a further aspect, the present invention relates to a method for cleaving a crystalline sample by a device, the method comprising placing the crystalline sample on a surface of the device (e.g., in a sample holder); contacting, by a first surface support element of the device, a first surface of the crystalline sample; applying, by upper and lower bending elements of the device that contact upper and lower surfaces of the crystalline sample, a bending moment on the crystalline sample; and contacting a cleaving element of the device with a second surface of the crystalline sample while applying the bending moment on the crystalline sample. As for the present device, the second surface is opposite to the first side and may be oriented to the upper and lower surfaces of the crystalline sample.

In various embodiments, contacting the cleaving element of the device with the second surface may comprise colliding the cleaving element of the device with the second surface. In additional or alternative embodiments, the method may further comprise contacting (i) the upper surface of the crystalline sample with a plurality of upper bending elements and (ii) the lower surface of the crystalline sample with one (or more) lower bending elements, and/or aligning the cleaving element with the cleaving line or plane of the crystalline sample. Typically, contacting the cleaving element of the device with the second surface cleaves the crystalline sample into two sample segments. The sample segments may have a length-to-width ratio of up to 30.

As for the present device, a trajectory of the lower bending element on the lower surface of the crystalline sample may be located between trajectories of a pair of upper bending elements on the upper surface of the crystalline sample. Furthermore, the crystalline sample may define or be in a first plane, and the upper and lower bending elements are not in the first plane and are not in any same or common plane orthogonal to the first plane.

In further embodiments, the method may further comprise positioning the specimen, using one or more (e.g., left and right) end-effecters, for cleaving with the cleaving element, and/or contacting the first surface of the specimen with a first surface support element and moving the specimen with a first surface support element towards the cleaving element and/or until the specimen contacts the one or more end-effecters.

Prealignment of the sample prior to cleaving is not critical or even required in the present device and method. These and other advantages of the present invention will become readily apparent from the detailed description of various embodiments below.

BRIEF DESCRIPTION OF THE DRAWINGS

The present invention will be understood and appreciated more fully from the following detailed description taken in conjunction with the drawings in which:

FIG. 11 illustrates an exemplary method according to one or more embodiments of the invention.

DETAILED DESCRIPTION

Figure 1:
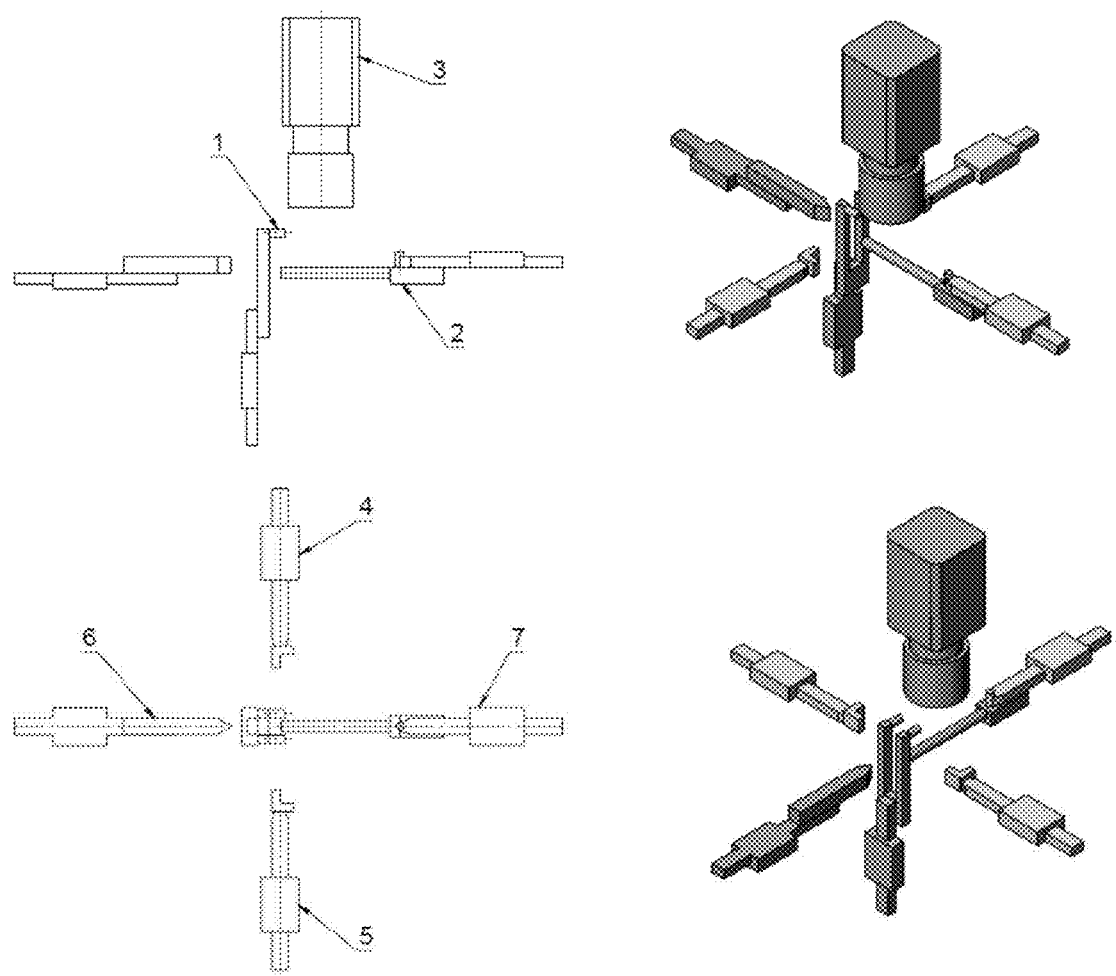
FIG. 1 is a general view of key components of an exemplary device or apparatus.

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and materials have not been described in detail so as not to unnecessarily obscure aspects of the present invention.

The technical proposal(s) of embodiments of the present invention will be fully and clearly described in conjunction with the drawings in the following embodiments. It will be understood that the descriptions are not intended to limit the invention to these embodiments. Based on the described embodiments of the present invention, other embodiments can be obtained by one skilled in the art without creative contribution and are in the scope of legal protection given to the present invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise.

Because the apparatus or (or implementing) the present invention includes, for the most part, electronic components and circuits known to those skilled in the art, circuit details will not be explained in any greater extent than that considered necessary for the understanding and appreciation of the underlying concepts of the present invention, and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

The system and method can be applied in the field of semiconductors, MEMS devices and materials science. The device, system and/or apparatus is/are applicable, but not restricted, to cross sectioning (e.g., of monocrystalline materials) for subsequent imaging and micro-analysis, dicing of microelectronic chips out of semiconductor wafers, and extraction of specimens out of mono-crystalline materials (e.g., from a bulk mono-crystalline material or the bulk portion of a mono-crystalline material).

The method and the device facilitate cleaving of monocrystalline specimens. For example, the present method and device can be applicable to cross-sectioning of monocrystalline materials for subsequent imaging and micro-analysis, dicing of microelectronic chips out of semiconductor wafers, and/or for extraction of specimens out of a bulk mono-crystalline material or a bulk portion of one or more mono-crystalline materials.

FIGS. 1-8 illustrate a device that includes a pair of upper pressing pins 1 and a supporting pin 2 that act as upper and lower bending elements. It is noted that the number, shape, size, of the upper and lower bending elements may differ from those illustrated in FIGS. 1-7. For example, when there is one upper pressing pin 1, there are generally two (or more) supporting pins 2. FIGS. 1-8 also show the following elements: upper pressing pins 1; supporting pin 2; imaging device 3; end-effecters 4 and 5; cleaving knife 6; and first surface support element 7.

FIG. 1 is a general view of key components of the apparatus, where one or more upper pressing pins 1 are located above the upper surface of a specimen and pressing solely on its upper surface. Their function is to be the first of two preloading elements to produce a 3-point bending moment on the specimen to be cleaved. The upper pressing pins 1 are connected to an actuator that controls movement and the preloading force of the pins 1.

A supporting pin 2 is located beneath the lower surface of the specimen. It supports the specimen against the force and bending moment from the upper pressing pins (1). Its function is to be the second of the two preloading elements to produce the 3-point bending moment on the specimen to be cleaved. The supporting pin 2 is statically positioned and its axis is co-axial with a cleaving line or plane of the specimen.

An imaging device 3 is located above the specimen and controls positioning of the specimen into the cleaving apparatus. The imaging device 3 may be configured to enable an operator to navigate to a target feature and/or a designation thereof.

Left and right angular end-effecters 4 and 5 along with their respective actuators position the specimen by pushing the specimen in a linear direction (e.g., the x-direction) opposite to the other end-effecter 4 or 5. The angular end-effecters (4) and (5) may reduce, minimize or prevent any damage to delicate layers of interest on the upper specimen surface during specimen handling and positioning.

A cleaving knife 6 is located on a corresponding actuator. Its function is to collide with and/or indent a second surface (e.g., a side wall) of the specimen. It may indent the second surface, and this indentation results in cleave/fracture propagation, and it acts simultaneously with the 3-point bending moment produced by the upper pressing pins 1 and the supporting pin 2. The cleaving knife 6 may be precisely aligned with the cleaving line or plane of the specimen. The apparatus and/or knife actuator may be configured for automatic cleaving of an initial segment of the specimen via a target feature or any other area of interest.

A first surface support element 7 (e.g., a pushing pin) contacts a first surface of the specimen (opposite to the second surface) and, along with its actuator, moves and pushes the specimen in an orthogonal direction (e.g., the y-direction) until the specimen contacts the angular end-effecters 4 and 5 (e.g., the L-brackets at the ends of the angular end-effecters 4 and 5 closest to the cleaving knife 6).

The center of the pushing pin 7 may be co-axial with a tip of the cleaving knife 6 and/or the cleaving line or plane of the specimen. It also serves as support during indentation by supporting the opposite surface or side wall of the specimen.

In further embodiments, the present apparatus may further comprise accessories for preliminary cleaving (e.g., a sample folder for preliminary cleaving using, e.g., a scriber and pliers), handling accessories for loading the specimen and/or unloading the cleaved specimen segments (e.g., semiconductor wafer segments), one or more vacuum chucks for handling of initially cleaved and fully processed specimen segments, a motion-based system for alignment and positioning of the specimen and/or segments thereof, an electronic control unit configured to operate the mechanical and/or electromechanical components of the apparatus (e.g., a conventional computer or workstation configured and/or programmed to operate the apparatus), a pneumatic control unit (e.g., to raise and/or lower the specimen holder table and/or actuate each of the actuators separately or in combination, and which may be controlled by the electronic control unit); and/or an interface for an operator to control, program, maintain, repair, upgrade and/or use the apparatus. The interface may comprise, for example, a conventional mouse, keyboard and/or monitor. The apparatus may further comprise a vacuum and air supply system configured to provide a variable vacuum where and as needed or desired (e.g., for one or more vacuum chucks) and/or to purge the atmosphere within the apparatus during specimen cleaving.

Figure 2:
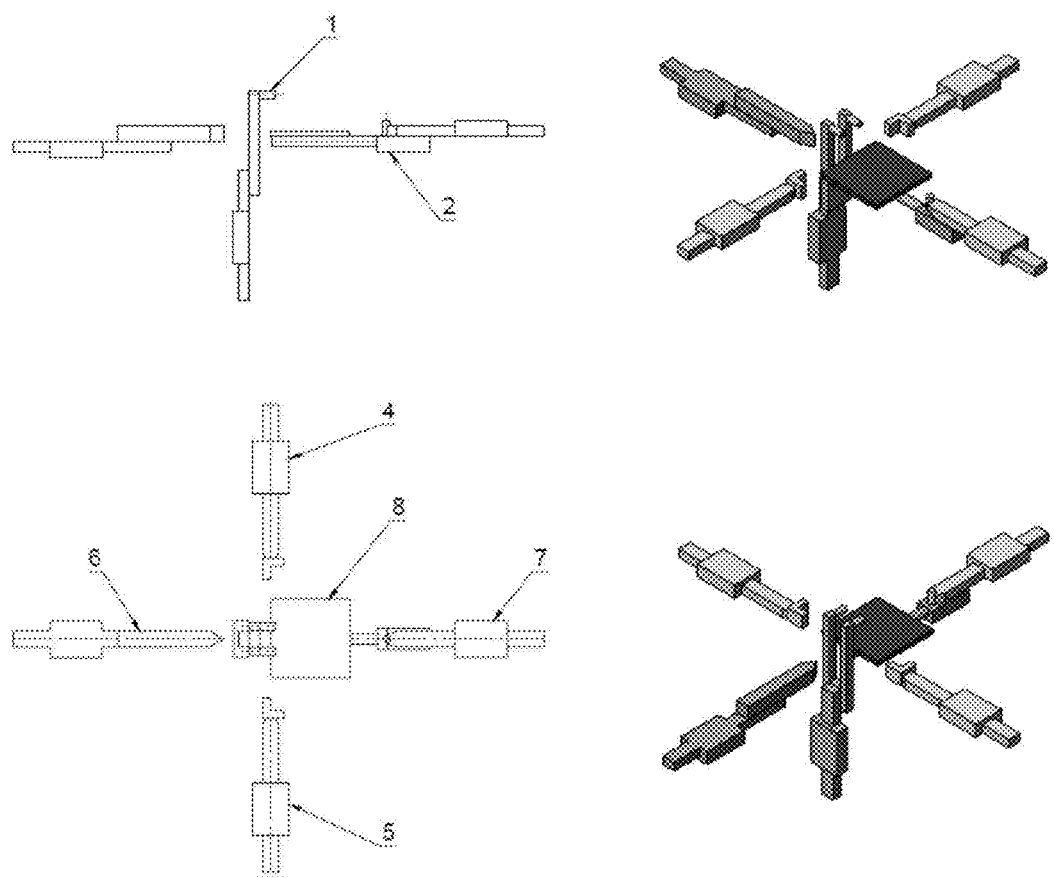
FIGS. 2-6, 8 and 10 illustrate the exemplary device operating on a crystalline sample according to various embodiments of the invention.

FIGS. 2-6 and 8 illustrate different stages in the cleaving process:

FIG. 2 illustrates a first stage that includes loading the specimen 8 into the cleaving unit and onto the supporting pin (2). The specimen may have substantially any dimensions for which a specimen holder can be made or configured, but in typical applications, the specimen may have minimum dimensions of 1 mm×1 mm×0.02 mm and maximum dimensions of 500 mm×500 mm×10 mm. The minimum and maximum specimen dimensions may also be any lower and upper dimension values within this range (e.g., from 4 mm×4 mm×0.1 mm to 100 mm×20 mm×1 mm).

Figure 3:
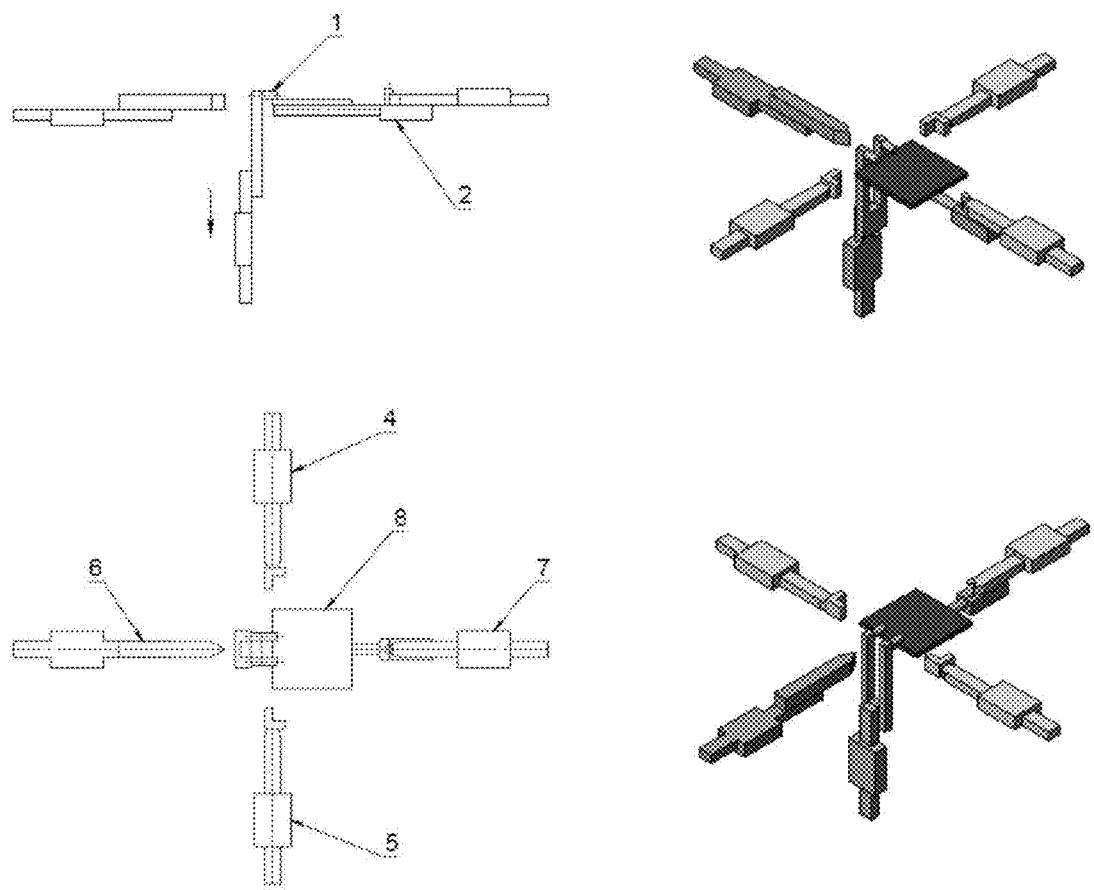

FIG. 3 illustrates a second stage that includes preloading of the specimen (8) by upper pressing pins (1) against the supporting pin (2).

Figure 4:
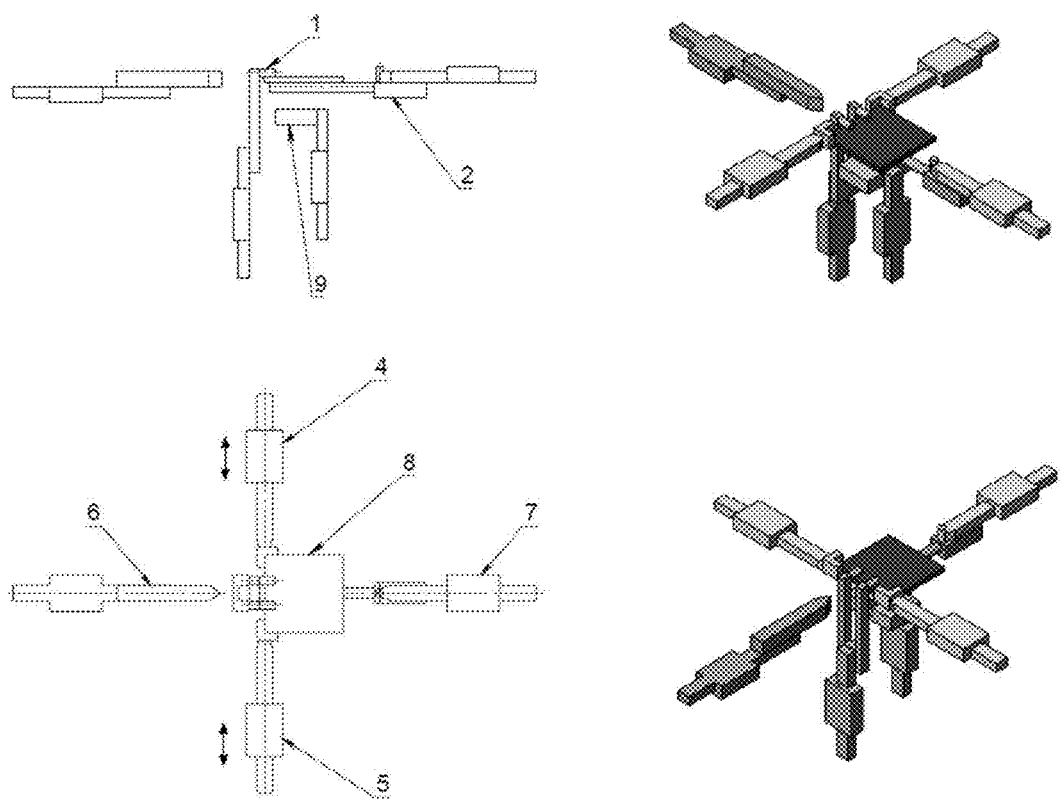

FIG. 4 illustrates a third stage that includes moving a left end-effecter (4) and a right end-effecter (5) in a direction orthogonal to the upper pressing pins (1) and the supporting pin (2) (e.g., the x-direction) until the left and right end-effecters (4) and (5) contact the specimen (8).

Figure 5:
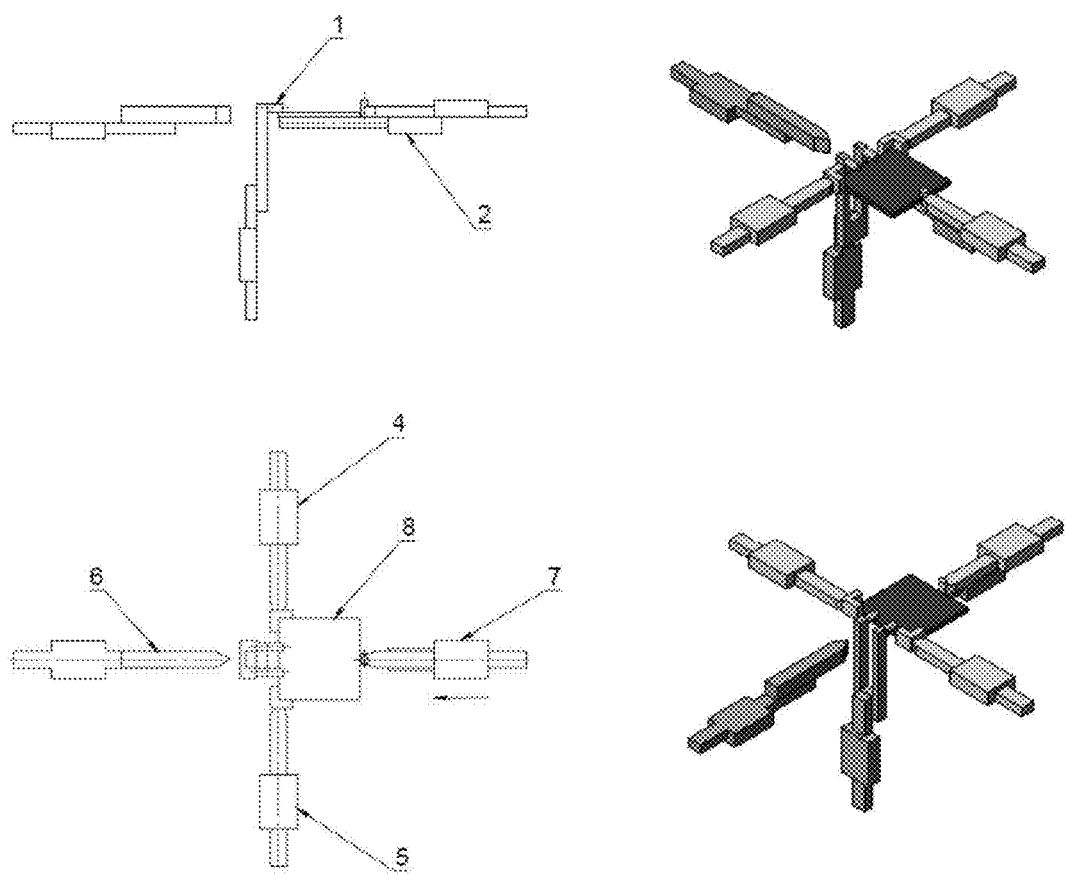

FIG. 5 illustrates a fourth stage that includes moving and positioning a pushing pin (7) in a direction orthogonal to the direction of movement of the left and right end-effecters (4) and (5) (e.g., the y-direction) until the pushing pin (7) contacts the specimen (8).

Figure 6:
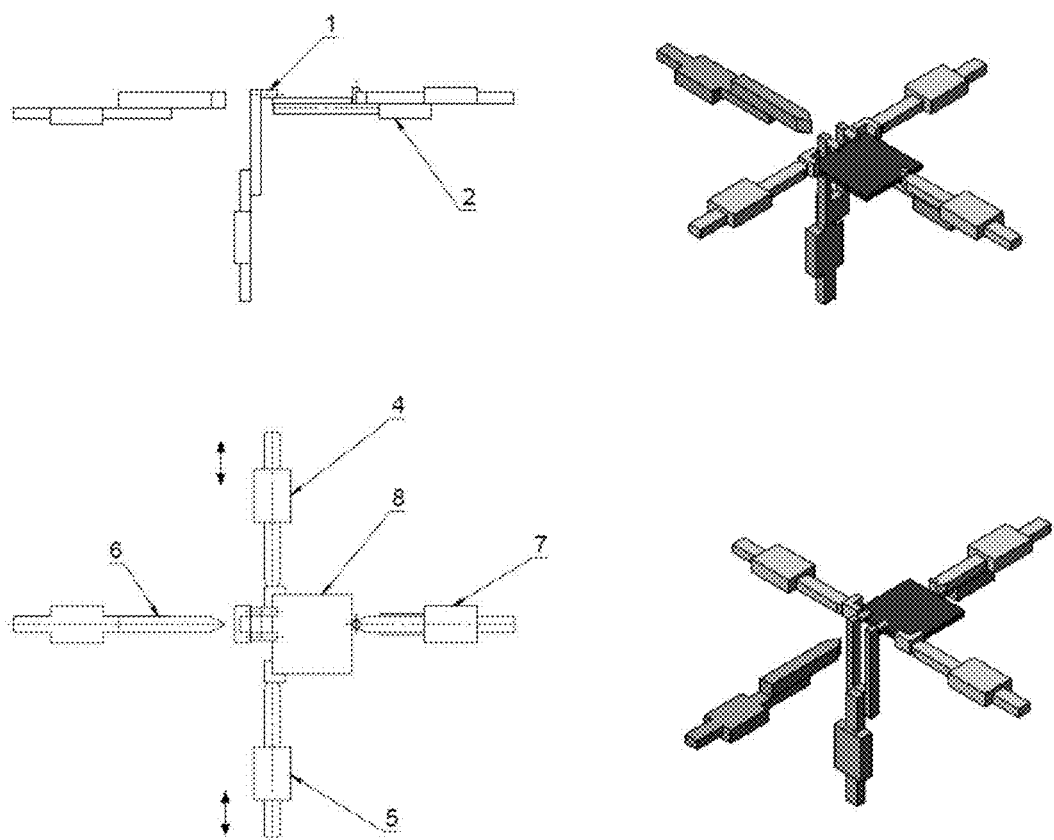
Figure 7:
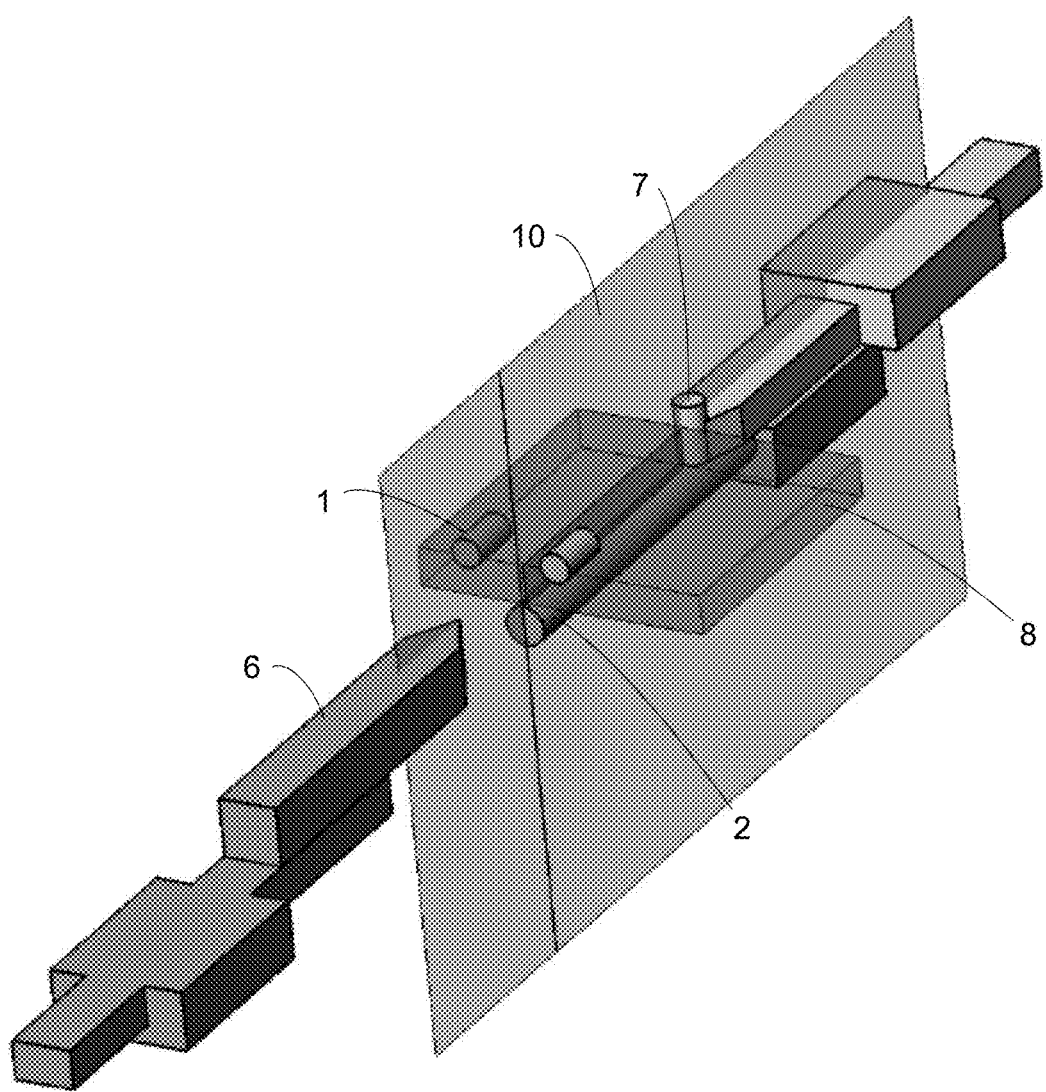
FIG. 7 illustrates a cleaving line or plane in the sample.

FIG. 6 illustrates a fifth stage that includes positioning the specimen (8) into a cleaving position by aligning (e.g., using the end effectors 4 and 5) the cleaving line or plane of the specimen (8) with the tip of the cleaving knife 6. As is shown in FIG. 7, the cleaving line or plane 10 of the specimen may be, for example, defined by the supporting pin 2 (e.g., along the horizontal line underneath the specimen 8 to be cleaved) and the pushing pin 7 (e.g., the vertical line opposite to the tip or edge of the cleaving knife 6). Optionally, the cleaving knife 6 (e.g., the tip or edge of the cleaving knife 6) may further define the cleaving line or plane 10.

Figure 8:
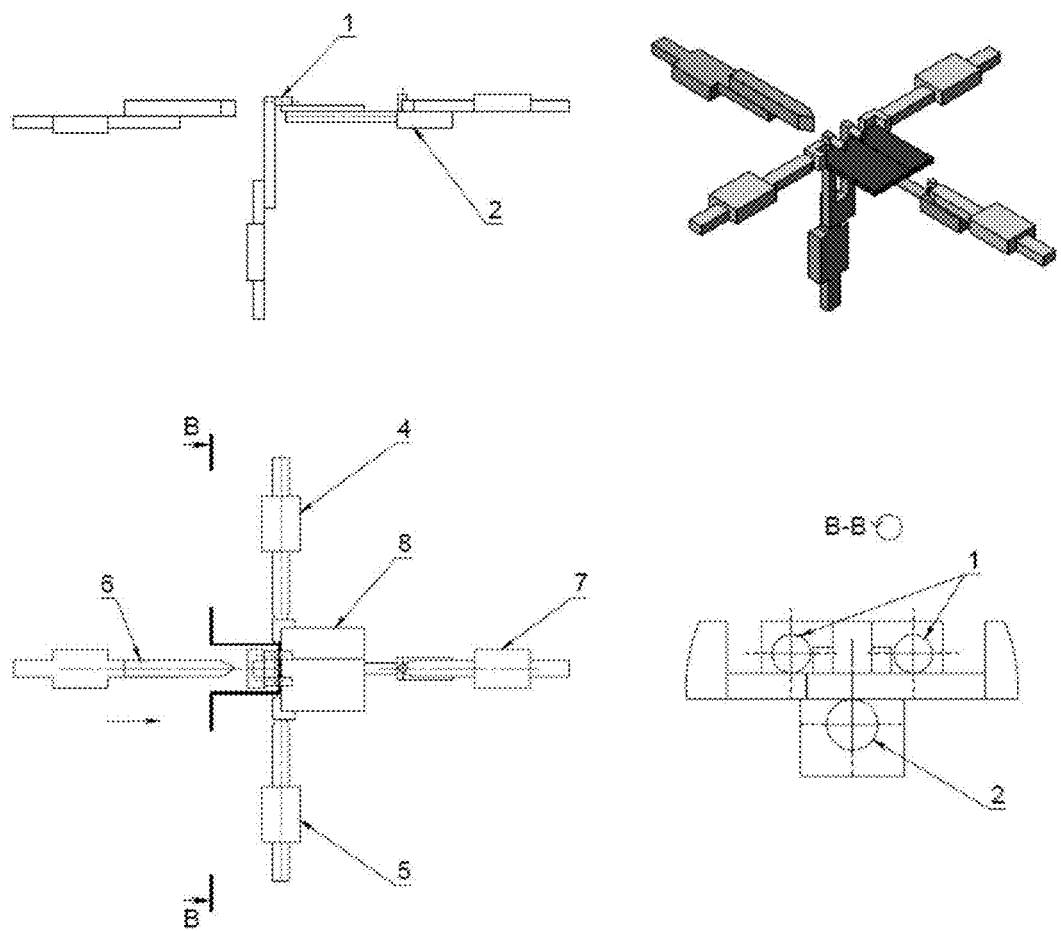

FIG. 8 illustrates a sixth stage that includes cleaving the specimen (8) across a pre-adjusted cleaving line or plane by simultaneous indentation of the side wall of the specimen 8 and application of the 3-point bending moment by upper pressing pins (1) and the supporting pin (2). After cleaving the specimen segments may have substantially any dimensions for which a specimen segment holder (such as a vacuum chuck or vacuum holder) can be made or configured, but in typical applications, the specimen segments may have minimum dimensions of 1 mm×0.5 mm×0.02 mm and maximum dimensions of 500 mm×498 mm×10 mm. The minimum and maximum specimen segment dimensions may also be any lower and upper dimension values within this range (e.g., from 4 mm×2 mm×0.1 mm to 98 mm×20 mm×1 mm). During specimen cleaving, the atmosphere within the cleaving device, system or apparatus may be purged and replaced with clean (e.g., filtered), dry air or nitrogen, in accordance with known techniques for doing so.

Figure 10:
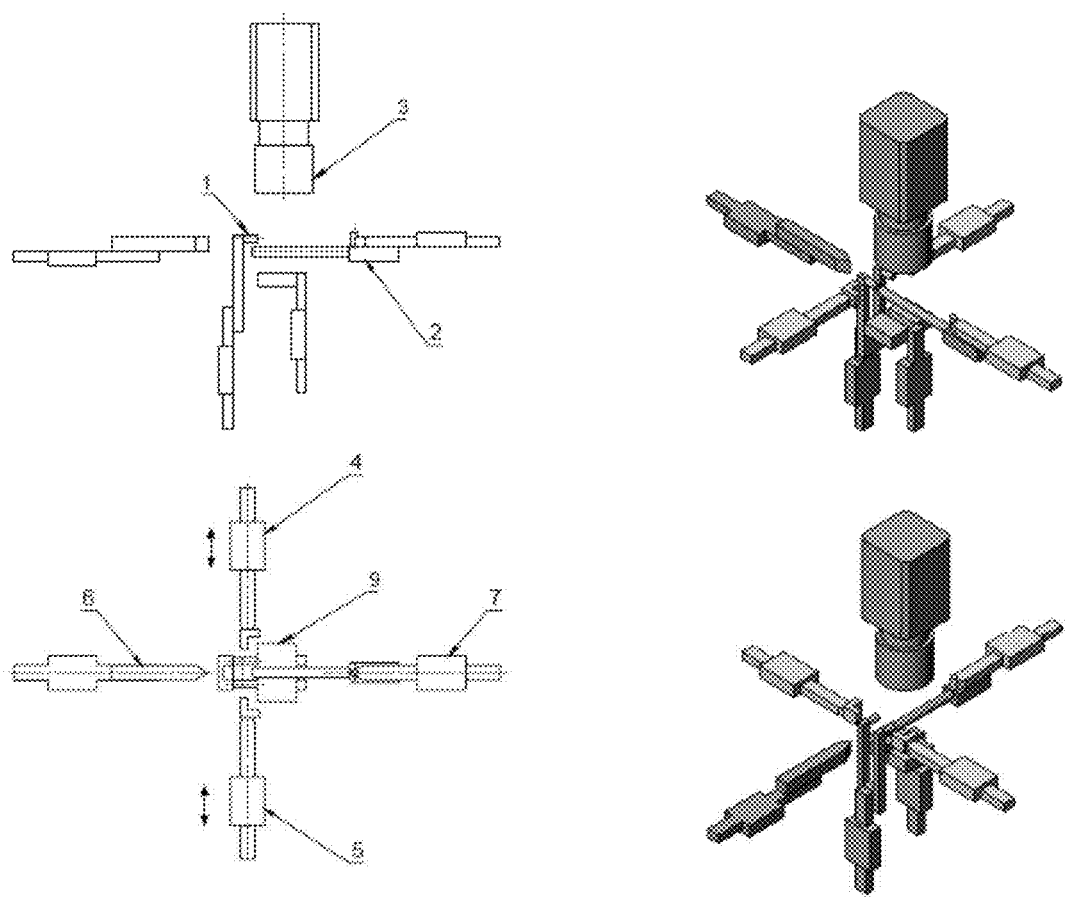

FIG. 10 illustrates a surface 9 in the device for specimen placement. The specimen 8 may be initially placed only on the supporting pin 2 (as illustrated in FIG. 2), or on a combination of the supporting pin 2 and one or more other elements, such as the surface 9 in FIG. 10. The supporting pin 2 may be higher than the surface 9 during the cleaving and/or other stages of the present method, even during the initial placement of the specimen 8. The surface 9 may be replaced by one or more supporting elements such as rods, brackets and/or pins that initially support the sample 8 and do not hamper application of the bending moment on the crystalline sample 8.

When applying the method, the sample is cleaved as a result of simultaneous application of the 3-point bending moment and indentation of a side wall or surface of the specimen 8. The direction of the indentation force by the cleaving knife 6 and the 3-point bending moment are orthogonal to each other. The 3-point bending moment results from pressing the upper pressing pins (1) on the upper surface of the specimen 8 against supporting pin (2) beneath the specimen 8. The supporting pin (2) is, in one example, co-axial with the cleaving line or plane of the specimen 8. The indentation may be produced by the force of the cleaving knife (6) striking or contacting the side wall (or second surface) of the specimen 8 against the pushing pin (7).

Figure 9:
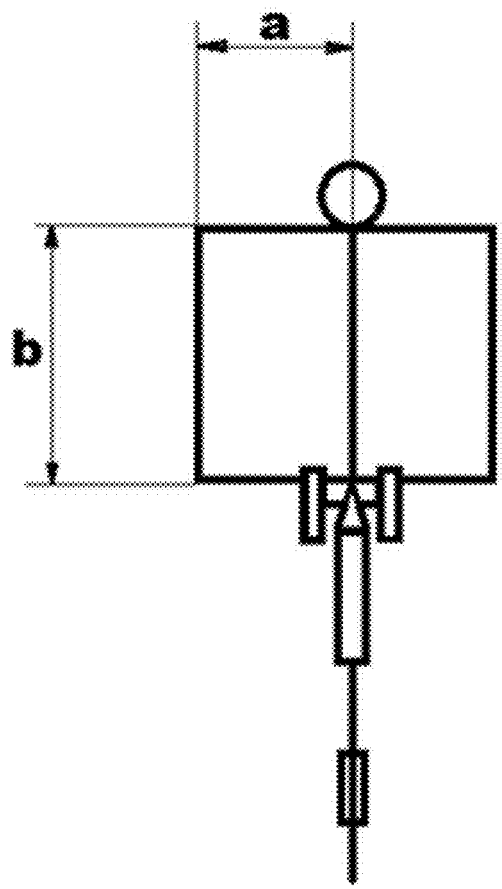
FIG. 9 illustrates a length-to-width cleaving ratio of the cleaved segments of the sample.

FIG. 9 illustrates a length-to-width cleaving ratio (b/a) of the cleaved segments of the sample or specimen. Existing cleaving equipment having submicron cleaving accuracy can only produce segments having a length-to-width cleave aspect ratio of less than 6. To the contrary, the present device/system/apparatus and method allows b/a ratios to be as high as 30 for monocrystalline Si specimens at a given submicron accuracy.

FIG. 11 illustrates a method 100 according to an embodiment of the invention. Method 100 may include the steps of placing a crystalline sample on a surface of the device or apparatus (step 110); contacting, by a first surface support element of the device, a first surface of the crystalline sample (step 120); applying, by upper and lower bending elements of the device that contact upper and lower surfaces of the crystalline sample, a bending moment on the crystalline sample (step 130); and contacting or colliding a cleaving element of the device with a second surface of the crystalline sample while the bending moment is applied on the crystalline element (step 140). The second surface is opposite to the first surface, and is oriented to the upper and lower surfaces of the crystalline sample. The device excludes any second surface alignment element for aligning the crystalline sample by contacting the second surface.

Examples of steps 110-140 are provided in FIGS. 2-6 and 8. However, other and/or alternative steps are possible. For example, the method may further comprise preparing the sample or specimen (e.g., an initial wafer segment) and/or loading the sample or specimen containing a target feature (e.g., for further imaging, study or examination) into the device, system or apparatus. Furthermore, the method may further comprise unloading the processed (cleaved) segments of the sample or specimen from the device, system or apparatus. The method may further comprise eliminating preparation artifacts in the area of interest (e.g., the target feature) prior to or during loading, and/or during or after unloading.

The cleaving in this method results from simultaneous application of a 3-point bending moment and the indentation of a specimen side wall or surface. The directions of the indentation force by the cleaving knife and the 3-point bending moment are orthogonal to each other. The 3-point bending moment results from pressure from the upper pressing pins (1) on the upper surface of the specimen against supporting pin (2) beneath the specimen. The supporting pin (2) may be co-axial with the cleaving line or plane of the specimen. The indentation may be produced by pressure from the cleaving knife (6) on the side wall or surface of the specimen against pushing pin (7).

Upper pins 1 and supporting pin 2 are not in the same plane with the specimen or sample. Furthermore, the upper pins 1 and the supporting pin 2 may not be in the same plane orthogonal to the specimen or sample (i.e., each pin 1 or 2 may have a different location along the x-direction). Upper pins 1 and supporting pin 2 act vertically (orthogonally), while the cleaving knife 6 acts horizontally in the plane of the specimen or sample. This set up enables an extremely large length-to-width aspect ratio when cleaving the sample. The cleave accuracy is sustained by alignment of the indenter tip with the cleaving line or plane.

Based on experimental data, the present apparatus and method allow b/a ratios (see FIG. 9) to be as high as 30 for monocrystalline Si specimens at a given submicron accuracy. In contrast, existing apparatuses for cleaving monocrystalline Si specimens with submicron accuracy can only produce specimen segments with a length-to-width cleave aspect ratios less than 6.

The present apparatus and method may be advantageously used in conjunction with other sample/specimen preparation methods to enable more detailed study and/or examination of the sample/specimen. For example, the present apparatus and method can be used in conjunction with focused ion beam (FIB) milling to cleave a sample through an area in which part of the surface of the sample has been removed by FIB milling. Alternatively, the present apparatus and method can be used in conjunction with broad ion beam milling to first cleave a sample, then polish the sample or remove surface defects by broad ion beam milling. A sample prepared by the present apparatus and/or method, alone or in combination with ion milling, can be further examined by scanning capacitance microscopy, scanning electron microscopy, transmission electron microscopy, etc.

Furthermore, those skilled in the art will recognize that boundaries between the above described operations and functionalities are merely illustrative. Multiple operations or functionalities may be combined into a single operation or device element, and/or a single operation or functionality may be distributed among plural operations or device elements. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The word "comprising" does not exclude the presence of other elements or steps then those listed in a claim. It is understood that the terms so used are interchangeable under appropriate circumstances such that the embodiments of the invention described herein are, for example, capable of operation in orientations or configurations other than those illustrated or otherwise described herein.

Furthermore, the terms "a" or "an," as used herein, generally refer to one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of a definite article. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. In the drawings and specification, there have been disclosed various embodiments and examples of the invention and, although specific terms are employed, they are used in a generic and descriptive sense only and not for the purpose of limitation. The embodiments were chosen and described in order to best explain the principles of the invention and its practical application. It is intended that the scope of the invention be defined by the claims appended hereto and their equivalents.

What is claimed is:

1. A device for cleaving a crystalline sample, comprising:
   upper and lower bending elements that are arranged to contact upper and lower surfaces of the crystalline sample and to apply a bending moment or force on the crystalline sample, wherein a trajectory of the lower bending element on the lower surface of the crystalline sample is located between trajectories of the pair of upper bending elements on the upper surface of the crystalline sample;

a first support element operably connected to a first actuator configured to bring the first support element into contact with a first side surface of the crystalline sample; and a cleaving element operably connected to a second actuator configured to cause the cleaving element to apply a force to a second side surface of the crystalline sample opposite to the first side surface while the bending moment or force is applied on the crystalline element.

2. The device according to claim 1, wherein the second side surface is opposite to the first side surface and oriented to the upper and lower surfaces of the crystalline sample.

3. The device according to claim 1, wherein the device excludes any second side surface alignment element for aligning the crystalline sample by contacting the second side surface.

4. The device according to claim 1, wherein the upper and lower bending elements comprise a pair of upper bending elements and a lower bending element.

5. The device according to claim 1, wherein the lower bending element is configured to contact only a portion of the lower surface of the crystalline sample.

6. The device according to claim 5, wherein an area of the portion of the lower surface of the crystalline sample does not exceed 20% of a total area of the lower surface of the crystalline sample.

7. The device according to claim 1, wherein the upper and lower bending elements are configured to contact the upper and lower surfaces of the crystalline sample without contacting the second side surface of the crystalline sample.

8. The device according to claim 1, wherein the crystalline sample is in a first plane, and the upper and lower bending elements are not in the first plane and are not in any same plane orthogonal to the first plane.

9. The device according to claim 1, further comprising one or more end-effecters configured to position the crystalline sample for cleaving with the cleaving element, wherein the first support element is further configured to contact the first side surface of the crystalline sample and move the crystalline sample until the crystalline sample contacts the one or more end-effecters.

10. A device for cleaving a crystalline sample, comprising:

upper and lower bending elements that are arranged to contact upper and lower surfaces of the crystalline sample and to apply a bending moment or force on the crystalline sample;

a first support element operably connected to a first actuator configured to bring the first support element into contact with a first side surface of the crystalline sample;

a cleaving element operably connected to a second actuator configured to cause the cleaving element to apply a force to a second side surface of the crystalline sample opposite to the first side surface while the bending moment or force is applied on the crystalline element; and one or more end-effecters configured to position the crystalline sample for cleaving with the cleaving element;

wherein the first support element is further configured to contact the first side surface of the crystalline sample and move the crystalline sample until the crystalline sample contacts the one or more end-effecters.

11. The device of claim 10, wherein the second side surface is opposite to the first side surface and oriented to the upper and lower surfaces of the crystalline sample.

12. The device according to claim 10, wherein the device excludes any alignment element for aligning the crystalline sample by contacting the second side surface.

13. The device according to claim 10, wherein the upper and lower bending elements comprise a pair of upper bending elements and a lower bending element.

14. The device of claim 10, wherein the lower bending element is configured to contact only a portion of the lower surface of the crystalline sample.

15. The device according to claim 14, wherein an area of the portion of the lower surface of the crystalline sample does not exceed 20% of a total area of the lower surface of the crystalline sample.

16. The device according to claim 15, wherein the area of the portion of the lower surface of the crystalline sample does not exceed 10% of the total area of the lower surface of the crystalline sample.

17. The device according to claim 10, wherein the upper and lower bending elements are configured to contact the upper and lower surfaces of the crystalline sample without contacting the second side surface of the sample.

18. The device according to claim 10, wherein the sample is in a first plane, and the upper and lower bending elements are not in the first plane and are not in any same plane orthogonal to the first plane.

19. The device of claim 10, wherein the one or more end-effecters comprise left and right end-effecters, each having a respective actuator configured to push the specimen in a linear direction opposite to the other end-effecter.

20. The device according to claim 6, wherein the area of the portion of the lower surface of the crystalline sample does not exceed 10% of the total area of the lower surface of the crystalline sample.

* * * * *